(12) United States Patent
Jee et al.

(10) Patent No.: US 8,641,927 B2
(45) Date of Patent: *Feb. 4, 2014

(54) CONDUCTIVE PASTE, AND ELECTRONIC DEVICE AND SOLAR CELL INCLUDING AN ELECTRODE FORMED USING THE CONDUCTIVE PASTE

(75) Inventors: Sang-Soo Jee, Hwaseong-si (KR); Eun-Sung Lee, Seoul (KR); Se-Yun Kim, Seoul (KR); Sang-Mock Lee, Yongin-si (KR); Seung Yeon Lee, Seoul (KR)

(73) Assignee: Samsung Electronics Co., Ltd., Gyeonggi Do (KR)

( * ) Notice: Subject to any disclaimer, the term of this patent is extended or adjusted under 35 U.S.C. 154(b) by 260 days.

This patent is subject to a terminal disclaimer.

(21) Appl. No.: 13/048,348

(22) Filed: Mar. 15, 2011

(65) Prior Publication Data

US 2012/0048363 A1     Mar. 1, 2012

(30) Foreign Application Priority Data

Aug. 24, 2010   (KR) .................. 10-2010-0082069

(51) Int. Cl.
*H01B 1/00* (2006.01)

(52) U.S. Cl.
USPC ........... 252/500; 252/510; 252/512; 252/514; 136/244; 136/256; 524/113

(58) Field of Classification Search
USPC .......... 252/500, 510, 512, 514; 136/244, 256; 524/113
See application file for complete search history.

(56) References Cited

U.S. PATENT DOCUMENTS

| | | | |
|---|---|---|---|
| 2006/0102228 A1* | 5/2006 | Sridharan et al. ............ | 136/256 |
| 2007/0072969 A1* | 3/2007 | Lee et al. ..................... | 524/113 |
| 2007/0102676 A1* | 5/2007 | Lee et al. ..................... | 252/500 |
| 2007/0157852 A1 | 7/2007 | Lee et al. | |
| 2009/0101190 A1* | 4/2009 | Salami et al. ................ | 136/244 |
| 2010/0037990 A1 | 2/2010 | Suh | |

FOREIGN PATENT DOCUMENTS

| | | |
|---|---|---|
| JP | 2009-099371 A | 5/2009 |
| JP | 2009-138266 A | 6/2009 |
| JP | 2010-018878 A | 1/2010 |
| KR | 1020020037772 A | 5/2002 |
| KR | 100790864 B1 | 12/2007 |

OTHER PUBLICATIONS

Don-Ik Lee, et al., "Effect of TRITONTM X-based Dispersants Bearing a Carboxylic Terminal Group on Rheological Properties of BAM/Ethyl CelluloselTerpineol Paste", Jounal of Applied Polymer Science, vol. 105, 2012-2019 (2007).

(Continued)

*Primary Examiner* — Khanh Tuan Nguyen
(74) *Attorney, Agent, or Firm* — Harness, Dickey & Pierce, P.L.C.

(57) ABSTRACT

A conductive paste including a combination of: a conductive powder, a metallic glass, and a dispersing agent represented by the following Chemical Formula 1

$$R^1\text{-}L^1\text{-}(OR^2)_n\text{-}(OR^3)_m\text{-}O\text{-}L^2\text{-}COOH.$$   Chemical Formula 1

In Chemical Formula 1, $R^1$ is a substituted or unsubstituted C5 to C30 branched alkyl group, $R^2$ and $R^3$ are each independently a substituted or unsubstituted C2 to C5 alkylene group, $L^1$ is a substituted or unsubstituted C6 to C30 arylene group, $L^2$ is a single bond or a C1 to C4 alkylene group, n and m are each independently integers ranging from 0 to about 30, and $3 \leq n+m \leq 30$.

26 Claims, 10 Drawing Sheets

(56) References Cited

OTHER PUBLICATIONS

Don-Ik Lee, et al., "Plasma Display Material Prepared from a New Blue Phosphor Dispersion", Journal of Applied Polymer Science, vol. 108, 2571-2577 (2008).

Don-Ik Lee, et al., "Synthesis and Characterization of Tritontm X-Based Surfactants with Carboxylic or Amino Groups in the Oxyethylene Chain End", Journal of Applied Polymer Science, vol. 104, 162-170 (2007).

Mohamed M. Hilali, et al., "Effect of Ag particle size in thick-film Ag paste on the electrical and physical properties of screen printed contacts and silicon solar cells", Journal of the Electrochemical Society, vol. 153, (1) A5-A11, (2006).

* cited by examiner

CONDUCTIVE PASTE, AND ELECTRONIC DEVICE AND SOLAR CELL INCLUDING AN ELECTRODE FORMED USING THE CONDUCTIVE PASTE

CROSS-REFERENCE TO RELATED APPLICATION

This application claims priority to Korean Patent Application No. 10-2010-0082069, filed on Aug. 24, 2010, and all the benefits accruing therefrom under 35 U.S.C. §119, the content of which in its entirety is herein incorporated by reference.

BACKGROUND

1. Field

This disclosure relates to a conductive paste, and an electronic device and a solar cell including an electrode formed using the conductive paste.

2. Description of the Related Art

A solar cell is a photoelectric conversion device that transforms solar energy into electrical energy. Solar cells have attracted much attention as a potentially infinite but pollution-free next generation energy source.

A solar cell includes p-type and n-type semiconductors and produces electrical energy when solar light energy is absorbed in a photoactive layer of the semiconductors and produces electron-hole pairs ("EHP"), and then the electrons and holes are respectively transferred to the n-type and p-type semiconductors and collected in each electrode.

A solar cell is desirably as efficient as possible for the production of electrical energy from solar energy. In order to improve this efficiency, it needs to effectively absorb light with less loss to produce as many electron-hole pairs as possible, and then collect the produced charges without substantial loss.

An electrode of a solar cell may be manufactured using a screen-printing method using a conductive paste. However, commercially available electrodes have undesirable resistive losses. Accordingly there remains a need for an improved paste which provides a solar cell electrode having more efficient charge collection.

SUMMARY

An aspect of the present disclosure provides a conductive paste which provides improved dispersion and improved conductivity.

Another aspect, feature, and advantage provides an electronic device including an electrode formed using the conductive paste.

Yet another aspect, feature, and advantage provides a solar cell including an electrode formed using the conductive paste.

According to an embodiment of this disclosure, provided is a conductive paste including a combination of a conductive powder, at least one of a metallic glass and glass frit, and a dispersing agent represented by the following Chemical Formula 1.

Chemical Formula 1

In Chemical Formula 1, $R^1$ is a substituted or unsubstituted C5 to C30 branched alkyl group, $R^2$ and $R^3$ are each independently a substituted or unsubstituted C2 to C5 alkylene group, $L^1$ is a substituted or unsubstituted C6 to C30 arylene group, $L^2$ is a single bond or a C1 to C4 alkylene group, n and m are each independently integers ranging from 0 to about 30, and $3 \leq n+m \leq 30$.

The dispersing agent may be represented by the following Chemical Formula 2.

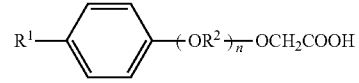

Chemical Formula 2

In Chemical Formula 2, $R^1$ is a substituted or unsubstituted C5 to C30 branched alkyl group, $R^2$ is a substituted or unsubstituted C2 to C5 alkylene group, and n is an integer ranging from 0 to about 30.

The dispersing agent may be represented by the following Chemical Formula 3.

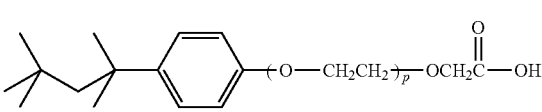

Chemical Formula 3

In Chemical Formula 3, p is an integer ranging from about 3 to about 10.

The dispersing agent may be present in an amount ranging from about 0.5 to about 10 parts by weight, based on 100 parts by weight of the conductive powder and the metallic glass.

The metallic glass may be an amorphous alloy including copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

The glass transition temperature (Tg) of the metallic glass may be lower than a eutectic point of silicon and the conductive powder.

The conductive powder and the metallic glass may have a eutectic point that is lower than a eutectic point of silicon and the conductive powder.

The metallic glass may be a liquid at the sintering temperature of the conductive powder.

The conductive powder may include silver (Ag), aluminum (Al), copper (Cu), nickel (Ni), or a combination thereof.

The conductive paste may further include an organic vehicle.

The conductive powder, the metallic glass, and the organic vehicle may be present in an amount of about 30 to about 98 weight percent (wt %), about 1 to about 50 wt %, and about 1 to about 50 wt %, respectively, based on total weight of the conductive paste, and the dispersing agent may be included in an amount of about 0.5 to about 10 parts by weight, based on 100 parts by weight of the conductive powder and the metallic glass.

According to another aspect of this disclosure, provided is an electronic device including an electrode including a fired conductive paste including a conductive powder, at least one of a metallic glass and glass frit, and a dispersing agent represented by the following Chemical Formula 1.

    Chemical Formula 1

In Chemical Formula 1, $R^1$ is a substituted or unsubstituted C5 to C30 branched alkyl group, $R^2$ and $R^3$ are each independently a substituted or unsubstituted C2 to C5 alkylene group, $L^1$ is a substituted or unsubstituted C6 to C30 arylene group, $L^2$ is a single bond or a C1 to C4 alkylene group, n and m are each independently integers ranging from 0 to about 30, and $3 \leq n+m \leq 30$.

The dispersing agent may be represented by the following Chemical Formula 2.

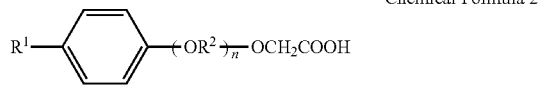    Chemical Formula 2

In Chemical Formula 2, $R^1$ is a substituted or unsubstituted C5 to C30 branched alkyl group, $R^2$ is a substituted or unsubstituted C2 to C5 alkylene group, and n is an integer ranging from 0 to about 30.

The dispersing agent may be represented by the following Chemical Formula 3.

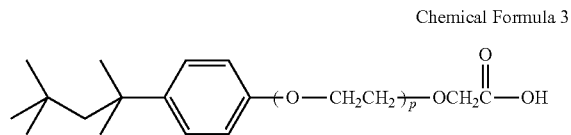    Chemical Formula 3

In Chemical Formula 3, p is an integer ranging from about 3 to about 10.

According to yet another aspect of this disclosure, provided is a solar cell including a silicon-containing semiconductor layer, and an electrode electrically connected with the semiconductor layer, wherein the electrode comprises a fired conductive paste, the conductive paste including a conductive powder, at least one of a metallic glass and glass frit, and a dispersing agent represented by the following Chemical Formula 1.

    Chemical Formula 1

In Chemical Formula 1, $R^1$ is a substituted or unsubstituted C5 to C30 branched alkyl group, $R^2$ and $R^3$ are each independently a substituted or unsubstituted C2 to C5 alkylene group, $L^1$ is a substituted or unsubstituted C6 to C30 arylene group, $L^2$ is a single bond or a C1 to C4 alkylene group, n and m are each independently integers ranging from 0 to about 30, and $3 \leq n+m \leq 30$.

The dispersing agent may be represented by the following Chemical Formula 2.

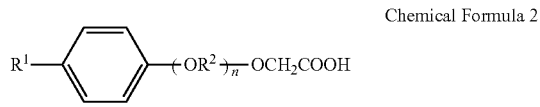    Chemical Formula 2

In Chemical Formula 2, $R^1$ is a substituted or unsubstituted C5 to C30 branched alkyl group, $R^2$ is a substituted or unsubstituted C2 to C5 alkylene group, and n is an integer ranging from 0 to about 30.

The dispersing agent may be represented by the following Chemical Formula 3.

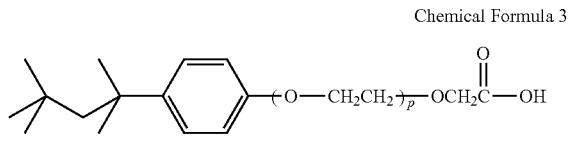    Chemical Formula 3

In Chemical Formula 3, p is an integer ranging from about 3 to about 10.

The solar cell may further include a buffer layer contacting the semiconductor layer and the electrode, wherein the buffer layer includes a metallic glass.

The solar cell may further include a first eutectic layer disposed between the electrode and the buffer layer, wherein the first eutectic layer is a product of the conductive powder and the metallic glass.

The solar cell may further include a second eutectic layer disposed between the semiconductor layer and the buffer layer, wherein the second eutectic layer is a product of the semiconductor material and the metallic glass.

The metallic glass may include an amorphous alloy of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

The conductive powder may include silver (Ag), aluminum (Al), copper (Cu), nickel (Ni), or a combination thereof.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, advantages and features of this disclosure will become more apparent by describing in further detail exemplary embodiments thereof with reference to the accompanying drawings, in which:

FIGS. 6 to 10A are schematic diagrams showing changes which occur to conductive particles of a conductive powder and a metallic glass when an embodiment of the conductive paste is heated;

DETAILED DESCRIPTION

Figure 1:
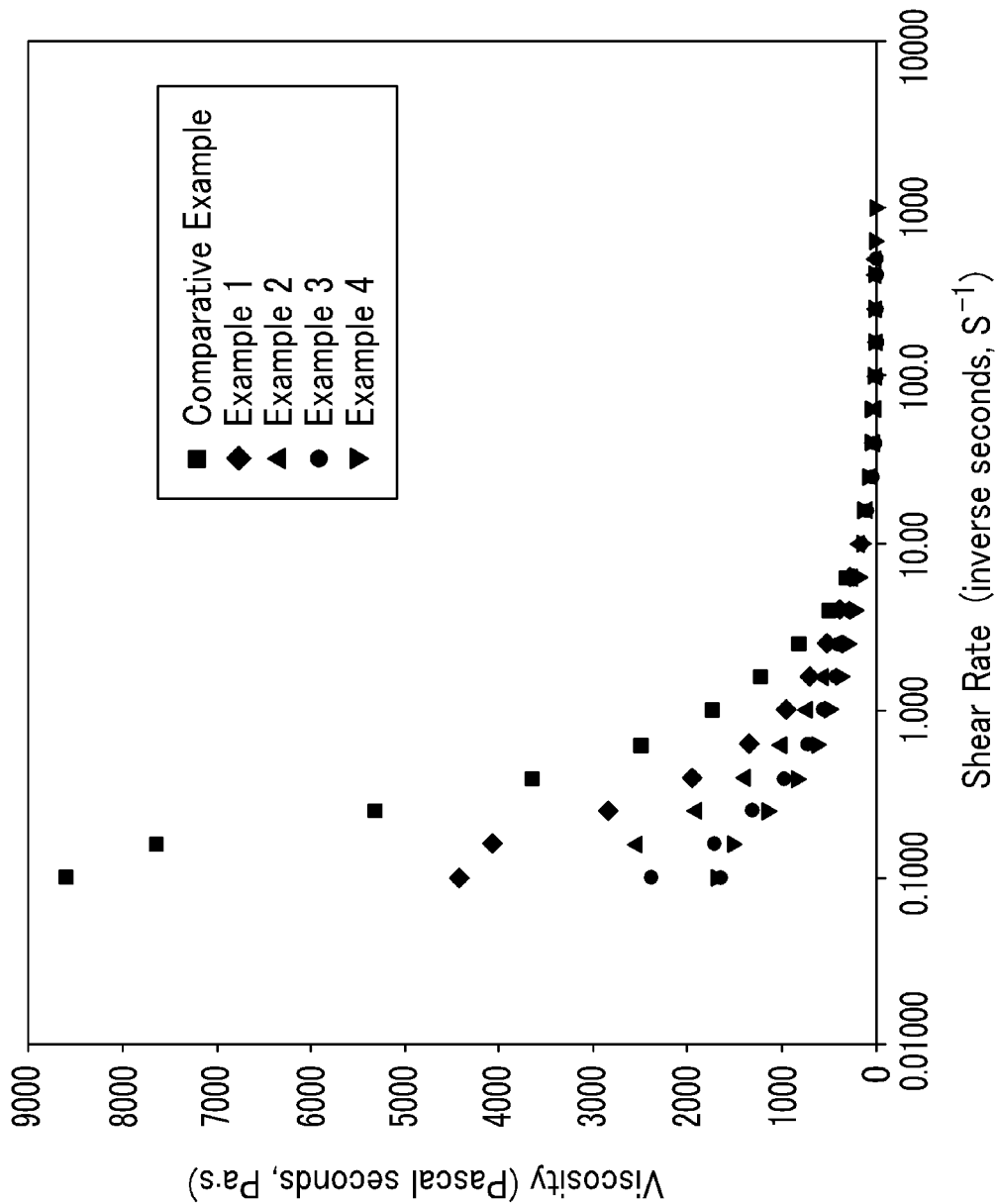
FIG. 1 is a graph of viscosity (Pascal seconds, Pa·S) versus shear rate (inverse seconds, $s^{-1}$) showing the viscosity change of conductive pastes according to Examples 1 to 4 and Comparative Example 1 as a function of the shear rate.

Exemplary embodiments of the present invention will hereinafter be described in further detail, in which various embodiments are shown. This disclosure may, however, be embodied in many different forms and should not be construed as limited to the exemplary embodiments set forth herein. Rather, these embodiments are provided so that this disclosure will be thorough and complete, and will fully convey the scope of the invention to those skilled in the art. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "a combination thereof" refers to a combination comprising at least one of the foregoing elements.

"Alkyl" means a straight or branched chain saturated aliphatic hydrocarbon having the specified number of carbon atoms, specifically 1 to 12 carbon atoms, more specifically 1 to 6 carbon atoms. Alkyl groups include, for example, groups having from 1 to 50 carbon atoms (C1 to C50 alkyl).

"Alkylene" means a straight, branched or cyclic divalent aliphatic hydrocarbon group, and may have from 1 to about 18 carbon atoms, more specifically 2 to about 12 carbons. Exemplary alkylene groups include methylene (—CH2-), ethylene (—CH2CH2-), propylene (—(CH2)3-), or cyclohexylene (—C6H10-).

"Arylene" means a divalent radical formed by the removal of two hydrogen atoms from one or more rings of an aromatic hydrocarbon, wherein the hydrogen atoms may be removed from the same or different rings (preferably different rings), each of which rings may be aromatic or non-aromatic.

"Oxyalkylene" means a divalent radical comprising an alkylene group to which at least one oxygen atom is covalently attached (e.g., via a single bond, forming a hydroxyalkylene or an ether group, or double bond, forming a ketone or aldehyde moiety).

"Substituted" means a compound or radical substituted with at least one (e.g., 1, 2, 3, 4, 5, 6 or more) substituents independently selected from a halide (e.g., F, Cl$^-$, Br$^-$, I$^-$), a hydroxyl, an alkoxy, a nitro, a cyano, an amino, an azido, an amidino, a hydrazino, a hydrazono, a carbonyl, a carbamyl, a thiol, a C1 to C6 alkoxycarbonyl, an ester, a carboxyl, or a salt thereof, sulfonic acid or a salt thereof, phosphoric acid or a salt thereof, a C1 to C20 alkyl, a C2 to C16 alkynyl, a C6 to C20 aryl, a C7 to C13 arylalkyl, a C1 to C4 oxyalkyl, a C1 to C20 heteroalkyl, a C3 to C20 heteroaryl (i.e., a group that comprises at least one aromatic ring, wherein at least one ring member is other than carbon), a C3 to C20 heteroarylalkyl, a C3 to C20 cycloalkyl, a C3 to C15 cycloalkenyl, a C6 to C15 cycloalkynyl, a C5 to C15 heterocycloalkyl, or a combination thereof, instead of hydrogen, provided that the substituted atom's normal valence is not exceeded.

First, a conductive paste according to an embodiment is further disclosed.

The conductive paste may comprise, consist essentially of, or consist of a combination of a conductive powder, at least one of a metallic glass and glass frit, and a dispersing agent.

The conductive powder may comprise an aluminum (Al)-containing metal such as aluminum or an aluminum alloy, a silver (Ag)-containing metal such as silver or a silver alloy, a copper (Cu)-containing metal such as copper (Cu) or a copper alloy, a nickel (Ni)-containing metal such as nickel (Ni) or a nickel alloy, or a combination thereof. In an embodiment, the conductive powder comprises Al, Cu, or Ni, or a combination thereof. In another embodiment, the conductive powder consists of Al, Cu, or Ni, or a combination thereof. However, the conductive powder is not limited thereto but may include other metals and another additive other than the metal.

The conductive powder may have a particle size (e.g., an average largest particle size) ranging from about 0.01 to about 100 micrometers (μm), specifically about 0.1 to about 50 μm, more specifically about 1 to about 25 μm.

The metallic glass is an amorphous alloy of two or more metals, and may have a disordered atomic structure. The metallic glass may be an amorphous metal. The metallic glass has low resistance, unlike an insulating glass such as silicate, and thus is electrically conductive. The metallic glass may have a resistivity of about 1 to about 1000 μΩcm, specially about 1 to about 700 μΩcm, more specially about 10 to about 400 μΩcm.

The metallic glass may include an alloy of a transition element, a noble metal, a rare earth element metal, an alkaline-earth metal, a semimetal, or the like, and for example, the metallic glass may comprise an amorphous alloy including copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof. In an embodiment, the metallic glass comprises Cu, Zr, Ag, Ti, Ni, Sn, Be, Nb, Ta, Al, Y, La, Mg, Gd, B, Fe, Ca, or combination thereof. The metallic glass may further optionally comprise a rare earth metal, and may include a misch metal (Mm).

The metallic glass may include, for example, $Cu_{50}Zr_{50}$, $Cu_{30}Ag_{30}Zr_{30}Ti_{10}$, $Ti_{50}Ni_{15}CU_{32}Sn_3$, $Ti_{45}Ni_{15}Cu_{25}Sn_3Be_7Zr_5$, $Ni_{60}Nb_{30}Ta_{10}$, $Ni_{61}Zr_{20}Nb_7Al_4Ta_8$, $Ni_{57.5}Zr_{35}Al_{7.5}$, $Zr_{41.2}Ti_{13.8}Ni_{10}Cu_{12.5}Be_{22.5}$, $Mg_{65}Y_{10}Cu_{15}Ag_5Pd_5$, $Mm_{55}Al_{25}Ni_{20}$, $La_{55}Al_{25}Ni_{10}Cu_{10}$, $Mg_{65}Cu_{7.5}Ni_{7.5}Ag_5Zn_5Gd_{10}$, $Mg_{65}Cu_{15}Ag_{10}Y_6Gd_4$, $Fe_{77}Nb_6B_{17}$, $Fe_{67}Mo_{13}B_{17}Y_3$, $Ca_{65}Mg_{15}Zn_{20}$, $Ca_{66.4}Al_{33.5}$, or a combination thereof, but is not limited thereto.

The metallic glass may soften at a glass transition temperature ("Tg") or at a temperature which is higher than the Tg. The softened metallic glass may contact the conductive powder in a much larger area than a contact area before the metallic glass is heated to the Tg.

In addition, when the conductive paste is disposed on a semiconductor substrate, the softened metallic glass may contact the conductive powder and the semiconductor substrate in a much larger area than a contact area before heating to the Tg.

The conductive powder and the metallic glass may form a first eutectic, the semiconductor material and the metallic glass may form a second eutectic, and the semiconductor material and the conductive powder may form a third eutectic.

Herein, the glass transition temperature ("Tg") of the metallic glass may be lower than a third eutectic point of a semiconductor material, such as silicon of a semiconductor substrate, and the conductive powder. Accordingly, when the conductive paste is heated, the metallic glass may soften before the third eutectic of the semiconductor material and the conductive powder forms.

Hereinafter, the foregoing is further illustrated referring to FIGS. 4 and 5.

Figure 4:
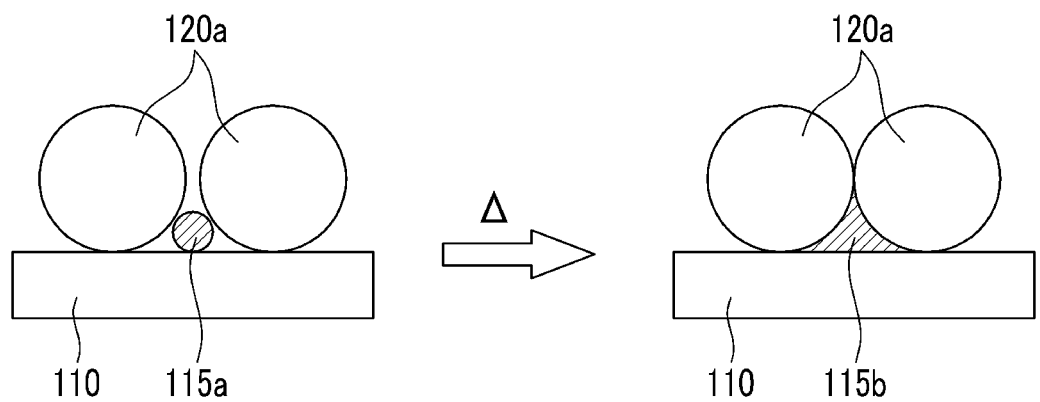
FIGS. 4 and 5 are schematic diagrams showing an embodiment in which a softened glass metal contacts a conductive powder and a semiconductor substrate when a conductive paste according to an embodiment is used.
Figure 5:
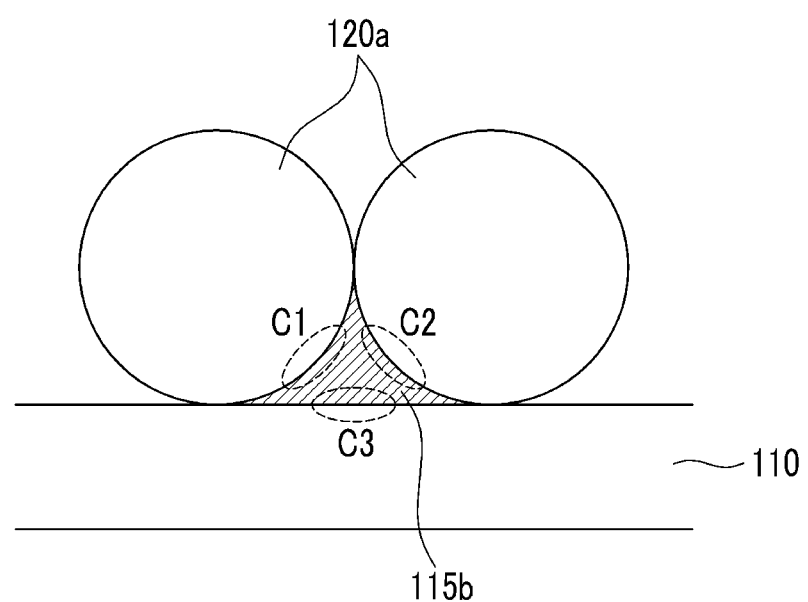

FIGS. 4 and 5 are schematic diagrams showing contact of a softened metallic glass with a conductive powder and a semiconductor substrate when an embodiment of a conductive paste is used.

Referring to FIG. 4, a conductive powder 120a and a metallic glass 115a, which are included in a conductive paste, may each comprise particles. When the conductive paste is disposed on a semiconductor substrate 110 and then heat-treated (Δ) at a temperature higher than a glass transition temperature ("Tg") of the metallic glass 115a, the metallic glass 115a softens and may partially or completely fill a gap among a plurality of particles of the conductive powder 120a.

Referring to FIG. 5, the softened metallic glass 115b forms first and second contact places C1 and C2, respectively, where the metallic glass contacts a conductive powder 120a, and a third contact place C3 where the metallic glass contacts the semiconductor substrate 110. In addition, the metallic glass may increase contact between the particles of the conductive powder 120a.

While not wanting to be bound by theory, it is believed that because the metallic glass softens at a temperature which is lower than the third eutectic point of the conductive powder 120a and the semiconductor material, the softened metallic glass is positioned between the conductive powder 120a and the semiconductor substrate 110, and the softened metallic glass causes particles of at least one of the conductive powder 120a and the semiconductor substrate 110 to become closer together. Accordingly, when the conductive paste is used to provide a solar cell, the fired conductive paste may provide an improved path through which charges generated in the semiconductor substrate 110 can reach the conductive powder 120a, thus improving transport of charges from the semiconductor substrate 110 to an electrode comprising a fired conductive paste.

In addition, the first eutectic of the conductive powder and the metallic glass may have a lower eutectic point than a eutectic point of the third eutectic of the semiconductor material and the conductive powder. Accordingly, the conductive powder and the metallic glass may form the first eutectic before the semiconductor material and the conductive powder form the third eutectic.

In addition, the second eutectic of the semiconductor material and the metallic glass may have a lower eutectic point than the eutectic point of the third eutectic of the semiconductor material and the conductive powder. Accordingly, the semiconductor material and the metallic glass may form the second eutectic before the semiconductor material and the conductive powder form the third eutectic.

When the conductive paste is disposed on a semiconductor substrate and heat treated, the metallic glass softens before the semiconductor material and conductive powder form the third eutectic. The metallic glass can form a eutectic with the conductive powder and also with the semiconductor material. Accordingly, and while not wanting to be bound by theory, it is believed that when the semiconductor material and the conductive powder form the third eutectic, the conductive powder is deeply permeated into the semiconductor material.

Hereinafter, further illustration of the foregoing is provided referring to FIGS. 6 to 10.

FIGS. 6 to 10 are a schematic diagram showing changes of the conductive powder and the metallic glass when the conductive paste is heated.

Figure 6:
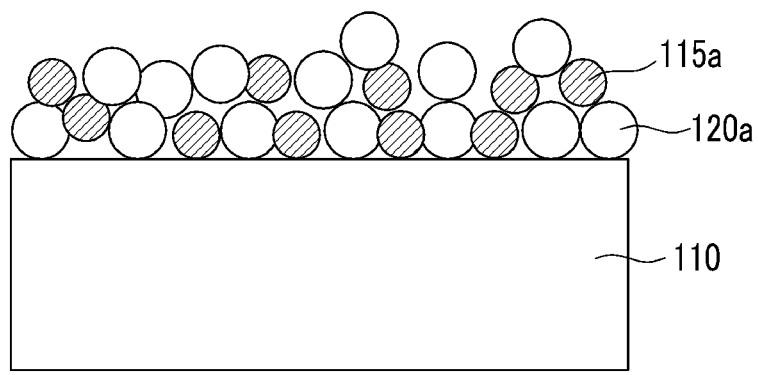

Referring to FIG. 6, a conductive paste including a conductive powder 120a and a metallic glass 115a is disposed (e.g., coated) on a semiconductor substrate 110.

Figure 7:
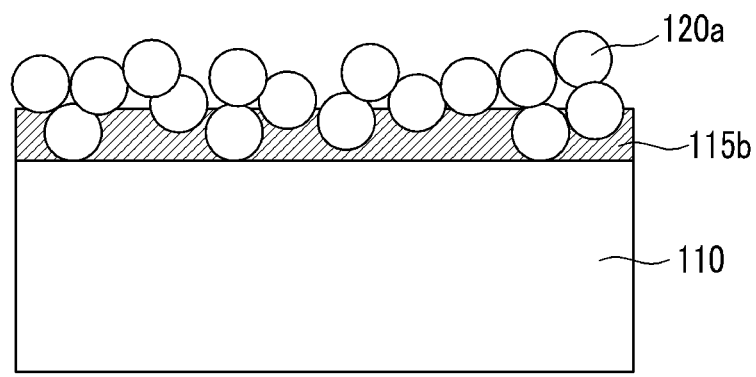

Referring to FIG. 7, when the metallic glass 115a is heated to a temperature which is higher than a glass transition temperature ("Tg") of the metallic glass, the metallic glass 115a may soften and become liquid on the surface of the semiconductor substrate 110. For example, when the metallic glass 115a includes $Cu_{50}Zr_{40}Al_{10}$, the glass transition temperature ("Tg") may be in a range of about 450 to about 500° C., specifically about 460 to about 480° C. Herein, when the softened metallic glass 115b has a low viscosity, it may improve wettability and may further increase contact between particles of the conductive powder.

Figure 8:
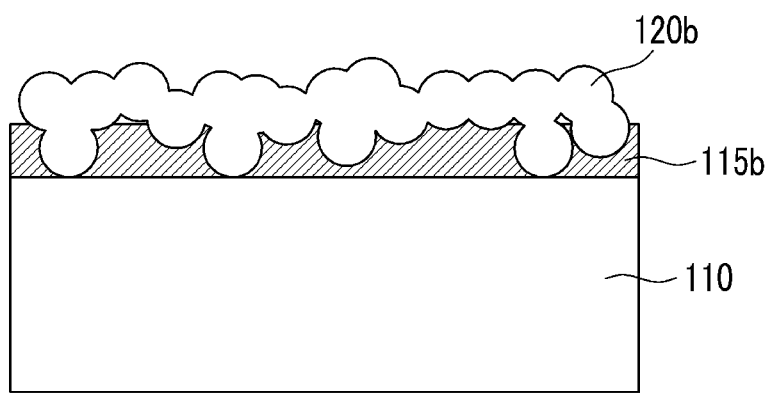

Referring to FIG. 8, when the conductive powder is heated to a temperature which is higher than a sintering temperature ("Ts") of the conductive powder 120a, the conductive powder 120a is sintered and particles of the conductive powder 120a close together to provide a sintered conductive powder 120b. For example, when the conductive powder 120a is silver (Ag), the sintering temperature ("Ts") may be in a range from about 580 to about 700° C., specifically about 600 to about 680° C., more specifically about 620 to about 660° C. The metallic glass may be a solid, a supercooled liquid, or a liquid at a sintering temperature of the conductive powder 120a.

Figure 9:
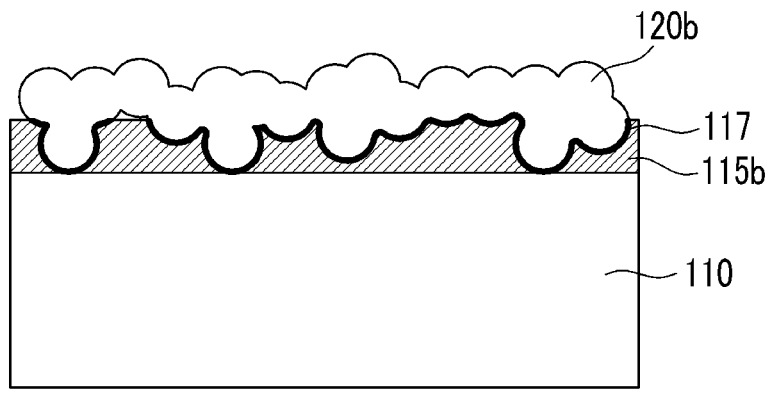

Referring to FIG. 9, the softened metallic glass 115b and the sintered conductive powder 120b are heated to a temperature which is higher than a first eutectic temperature ("T1"). For example, when the conductive powder 120b is silver (Ag) and the softened metallic glass 115b is $Cu_{50}Zr_{40}Al_{10}$, they may have a eutectic point of about 740 to about 820° C., specifically 760 to about 800° C., more specifically about 780° C. Herein, the conductive powder 120b and the softened metallic glass 115b may form the first eutectic, and may have improved contact properties, and form a first eutectic layer 117.

Figure 10A:
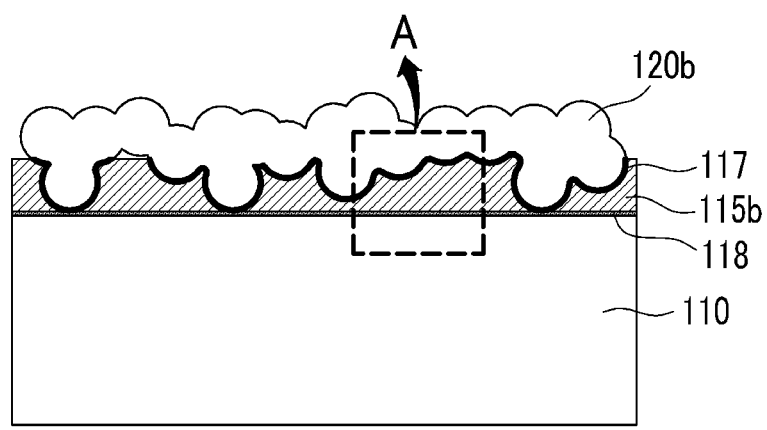
Figure 10B:
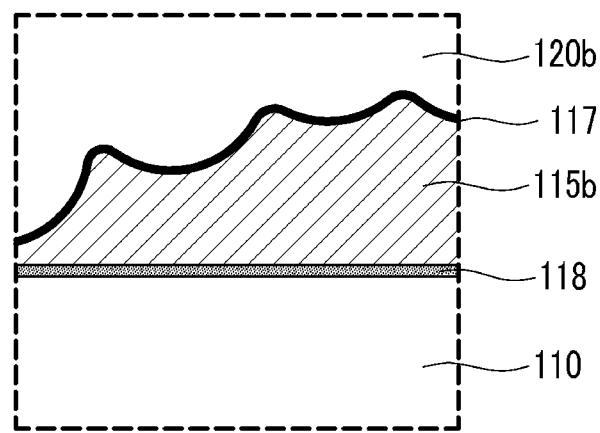
FIG. 10B is an enlarged view of the indicated portion of FIG. 10A.

Referring to FIGS. 10A and 10B, wherein FIG. 10B is an enlarged view of Section 'A' (as indicated by dashed lines), as shown in FIG. 10A, the softened metallic glass 115b and a semiconductor substrate 110 are heated higher than a second eutectic temperature (T2). For example, when the softened metallic glass 115b is $Cu_{50}Zr_{40}Al_{10}$ and the semiconductor substrate 110 comprises silicon, they may have a eutectic point of about 780 to about 820° C., specifically about 790 to about 810° C., more specifically about 802° C. The softened metallic glass 115b and the semiconductor substrate 110 may form a eutectic and may have improved contact properties, and may form a second eutectic layer 118.

The softened metallic glass 115b may crystallize at a selected temperature and may form a first buffer layer 115. The first buffer layer 115 may substantially or effectively prevent the conductive powder 120b from diffusing into the semiconductor substrate 110.

The glass frit may comprise, for example, a $PbO$—$SiO_2$-containing, a $PbO$—$SiO_2$—$B_2O_3$-containing, a $PbO$—$SiO_2$—$B_2O_3$—$ZnO$-containing, a $PbO$—$SiO_2$—$B_2O_3$—$BaO$-containing, a $PbO$—$SiO_2$—$ZnO$—$BaO$-containing, a $ZnO$—$SiO_2$-based, a $ZnO$—$B_2O_3$—$SiO_2$-containing, a $ZnO$—$K_2O$—$B_2O_3$—$SiO_2$—$BaO$-containing, a $Bi_2O_3$—$SiO_2$-containing, a $Bi_2O_3$—$B_2O_3$—$SiO_2$-containing, a $Bi_2O_3$—$B_2O_3$—$SiO_2$—$BaO$-containing, a $ZnO$—$BaO$—$B_2O_3$—$P_2O_5$—$Na_2O$-containing, or a $Bi_2O_3$—$B_2O_3$—$SiO_2$—$BaO$—$ZnO$-containing glass, or a combination thereof.

The dispersing agent may be represented by the following Chemical Formula 1.

Chemical Formula 1

In Chemical Formula 1,
$R^1$ is a substituted or unsubstituted C5 to C30 branched alkyl group, $R^2$ and $R^3$ are each independently a substituted or unsubstituted C2 to C5 alkylene group, $L^1$ is a substituted or unsubstituted C6 to C30 arylene group, $L^2$ is a single bond or a C1 to C4 alkylene group, n and m are each independently integers ranging from 0 to about 30, and 3≤n≤m30.

The dispersing agent may also be represented by the following Chemical Formula 2.

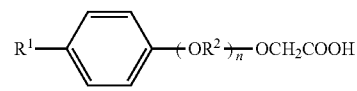

Chemical Formula 2

In Chemical Formula 2, $R^1$ is a substituted or unsubstituted C5 to C30 branched alkyl group, $R^2$ is a substituted or unsubstituted C2 to C5 alkylene group, and n is an integer ranging from 0 to about 30.

The dispersing agent may also be represented by the following Chemical Formula 3.

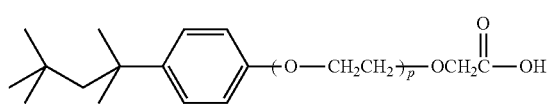

Chemical Formula 3

In Chemical Formula 3, p is an integer ranging from about 3 to about 10.

As shown in Chemical Formula 1, the dispersing agent has a hydrophobic moiety including a branched alkyl group and an arylene group and a hydrophilic moiety including an oxyalkylene group and a carboxyl group.

While not wanting to be bound by theory, it is believed that the branched alkyl group does not readily deform a hydrophobic moiety during its collision against other dispersing agent particles and this maintains its hydrophobic character. In addition, the branched alkyl group may increase repulsion among neighboring particles due to its bulky structure and thus may increase stability of the dispersion system by preventing coalescence.

The arylene group increases both the steric bulk and hydrophobicity of the hydrophobic group. The arylene group may be, for example, phenylene, indenylene, naphthalenylene, phenanthrenylene, anthracenylene, pyrenylene, or combination thereof.

The number of oxyalkylene groups may be easily controlled during manufacture of the dispersing agent by controlling the reaction conditions, and thus may allow control of the overall dispersion characteristics of the dispersing agent.

The group simultaneously includes two polar groups, a hydroxy group, and a carbonyl group. Without being bound by theory, it is believed that the carboxyl group may be well-absorbed on the surface of various particles with a polar surface.

Due to its advantageous combination of the hydrophobic and hydrophilic characteristics, the dispersing agent may have repulsion on the surface and may not be entangled together, which may increase the stability of the dispersion system.

In addition, because the dispersing agent improves dispersion, a conductive powder, or a higher concentration of the conductive powder, may be included in a conductive paste without sharply increasing the viscosity of the conductive paste, resulting in improved processability and/or increased conductivity of the conductive paste.

In addition, the dispersing agent may substantially or effectively prevent formation of a pore inside an electrode and formation of a non-uniform layer, because a smaller amount of carbon may remain after the firing, unlike a commercially available phosphate-containing dispersing agent.

The conductive paste may further include an organic vehicle.

The organic vehicle may include an organic compound providing an appropriate viscosity when combined with a conductive powder and a metallic glass, and a solvent for dissolving or suspending the organic compound.

The organic compound may include, for example, a (meth) acrylate resin, a cellulose such as ethyl cellulose, a phenol resin, an alcohol resin, tetrafluoroethylene ("TEFLON"), or a combination thereof, and may further include an additive such as a surfactant, a thickener, and a stabilizer.

The solvent may be any solvent that is capable of dissolving or suspending the above compounds, and may include, for example, terpineol, butylcarbitol, butylcarbitol acetate, pentanediol, dipentyne, limonene, ethylene glycol alkylether, diethylene glycol alkylether, ethylene glycol alkylether acetate diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, desalted water, or a combination thereof.

The conductive powder, the metallic glass which may comprise the glass frit, and the organic vehicle may be included in an amount of about 30 to about 98 weight percent (wt %), about 1 to about 50 wt %, and about 1 to about 50 wt %, respectively; specifically about 35 to about 96 weight percent (wt %), about 2 to about 45 wt %, and about 2 to about 45 wt %, respectively; more specifically about 40 to about 94 weight percent (wt %), about 3 to about 40 wt %, and about 3 to about 40 wt %, respectively, based on the total weight of the conductive paste. In addition, the dispersing agent may be included in an amount of about 0.5 to about 10 parts by weight, specifically about 1 to about 8 parts by weight, more specifically about 2 to about 6 parts by weight, based on 100 parts by weight of the conductive powder and the metallic glass.

The aforementioned conductive paste including the conductive powder, the metallic glass which may comprise the glass frit, and the dispersing agent may be fabricated into an electrode for an electronic device using a screen-printing method, or the like.

A representative electronic device is a solar cell.

Figure 11A:
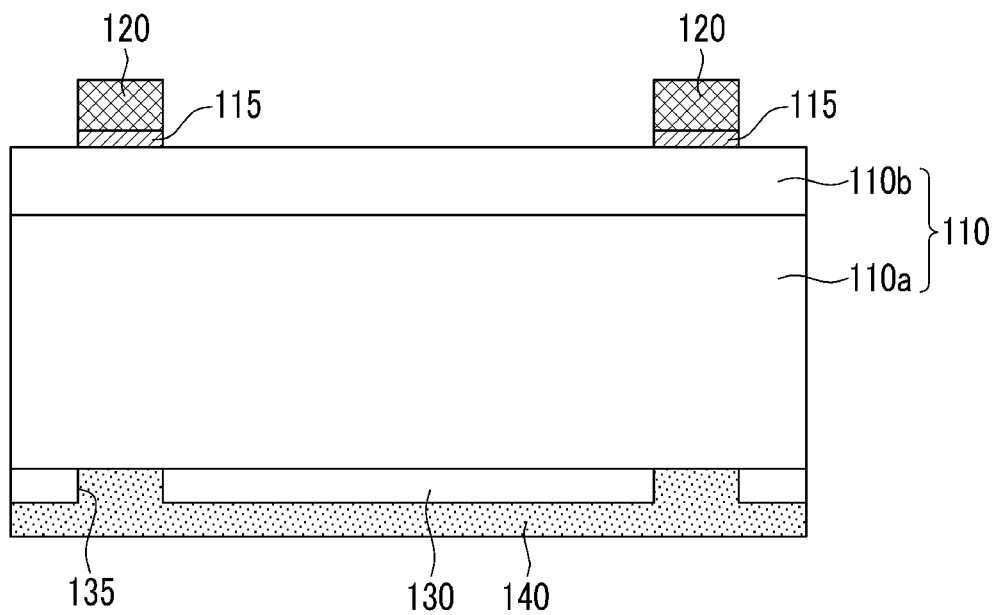
FIGS. 11A and 11B are cross-sectional views of an embodiment of a solar cell.
Figure 11B:
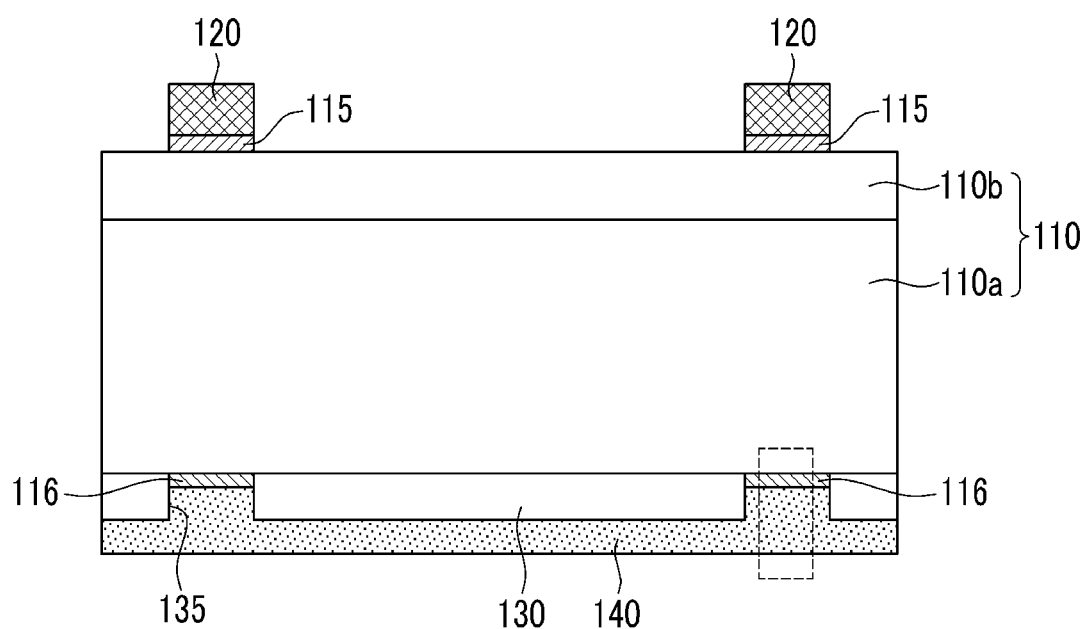

Referring to FIGS. 11A and B, a solar cell according to an embodiment is disclosed in further detail.

FIGS. 11A and B are each a cross-sectional view showing an embodiment of a solar cell.

In the drawings, the thickness of layers, films, panels, regions, etc., are exaggerated for clarity. Like reference numerals designate like elements throughout the specification. It will be understood that when an element such as a layer, a film, a region, or a substrate is referred to as being "on" another element, it can be directly on the other element or intervening elements may also be present. In contrast, when an element is referred to as being "directly on" another element, there are no intervening elements present.

Hereinafter, positions relative to a semiconductor substrate 110 will be described with respect to their relative vertical position for better understanding and ease of description, but are not limited thereto. In addition, a solar energy incident side of a semiconductor substrate 110 is called a front side, and the opposite side is called a rear side for ease of description.

Referring to FIGS. 11A and B, the solar cell may include a semiconductor substrate 110, comprising a lower semiconductor layer 110a and an upper semiconductor layer 110b.

The semiconductor substrate 110 may comprise a crystalline silicon or a compound semiconductor. The crystalline silicon may be, for example, a silicon wafer. One of the lower semiconductor layer 110a and the upper semiconductor layer 110b may be a semiconductor layer doped with a p-type impurity, and the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element, such as boron (B), and the n-type impurity may be a Group V element, such as phosphorus (P).

The upper semiconductor layer 110b may be surface-textured. The surface-textured upper semiconductor layer 110b may have protrusions and depressions, each of which may have a pyramid shape, for example, or the surface-textured upper semiconductor layer 110b may have a porous structure having a honeycomb shape. The surface-textured upper semiconductor layer 110b may have an enlarged surface area to enhance the light-absorption rate and to decrease reflectivity, which improves efficiency of a solar cell.

An insulation layer (not shown) may be provided on the upper semiconductor layer 110b. The insulation layer may be an anti-reflective coating ("ARC") that decreases light reflectivity, increases selective transmission of a particular wavelength region to the surface of the solar cell, and simultaneously improves the contact characteristics with silicon of the surface of the semiconductor substrate 110, resulting in increased efficiency of the solar cell.

A front electrode 120 is disposed on the upper semiconductor layer 110b. The front electrode 120 is disposed in a direction which is parallel to the direction of the substrate, and may have a grid pattern which minimizes shadowing loss and sheet resistance.

The front electrode 120 may comprise a conductive material, for example, a low resistance conductive material such as silver (Ag).

The front electrode 120 may be disposed using a screen printing method using a conductive paste. The conductive paste includes the conductive powder, the metallic glass, and the dispersing agent.

In an embodiment, a first buffer layer 115 is disposed between the upper semiconductor layer 110b and the front electrode 120. The first buffer layer 115 may include a metallic glass and thus may be electrically conductive. Because the first buffer layer 115 partly contacts the front electrode 120 and the upper semiconductor layer 110b, it may decrease loss of electric charges by enlarging the area of a path for transferring electric charges between the upper semiconductor layer 110b and the front electrode 120. In addition, the first buffer layer 115 may substantially or effectively prevent a material of the front electrode 120 from diffusing into the semiconductor substrate 110.

The metallic glass of the first buffer layer 115 may comprise the same metallic glass as the conductive paste of the front electrode 120, and thus may melt or soften before the conductive material of the front electrode 120 during processing, thereby disposing the first buffer layer 115 under the front electrode 120.

In addition, as shown for example in FIG. 10B, a first eutectic layer 117 is disposed between the front electrode 120 and the buffer layer first 115, and a second eutectic layer 118 is disposed between the first buffer layer 115 and the upper semiconductor layer 110b. The first eutectic layer 117 comprises the eutectic of a conductive material included in the front electrode 120 and a metallic glass included in the first buffer layer 115. The second eutectic layer 118 comprises the eutectic of a metallic glass included in the first buffer layer 115 and a semiconductor material included in the upper semiconductor layer 110b.

A bus bar electrode (not shown) may be disposed on the front electrode 120. The bus bar electrode may connect adjacent solar cells of a plurality of solar cells.

A dielectric layer 130 is disposed under the semiconductor substrate 110. The dielectric layer 130 may increase efficiency of a solar cell by substantially or effectively preventing recombination of electric charges and leaking of electric current. The dielectric layer 130 may include a plurality of penetration parts 135, through which the semiconductor substrate 110 may contact a rear electrode 140 that will be further disclosed below.

The dielectric layer 130 may comprise silicon oxide ($SiO_2$), silicon nitride ($SiN_x$), aluminum oxide ($Al_2O_3$), or a combination thereof, and may have a thickness ranging from about 100 to about 2000 Å, specifically about 200 to about 1800 Å, more specifically about 300 to about 1600 Å.

The dielectric layer 130 may be omitted.

The rear electrode 140 is disposed under the dielectric layer 130. The rear electrode 140 may comprise a conductive material, for example, an opaque metal such as aluminum (Al). The rear electrode 140 may be disposed using a screen printing method using the conductive paste in the same manner as disclosed for the front electrode 120.

Figure 11C:
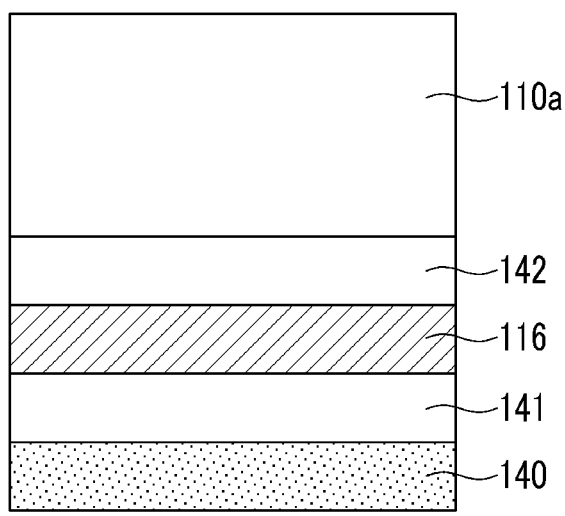
FIG. 11C is an enlarged view of the indicated portion of FIG. 11B.

A second buffer layer 116 is disposed between the rear electrode 140 and the lower semiconductor layer 110a in the same manner as disclosed for the first buffer layer 115 of front electrode 120. Further, as disclosed in FIG. 11C, a third eutectic layer 141 is disposed between the rear electrode 140 and the second buffer layer 116, and a fourth eutectic layer 142 is disposed between the lower semiconductor layer 110a and the second buffer layer 116 in the same manner as disclosed for the front electrode 120.

Hereinafter, a method of manufacturing the solar cell is described with reference to FIG. 11A.

First, a semiconductor substrate 110, such as a silicon wafer, is prepared. The semiconductor substrate 110 may be doped with a p-type impurity, for example.

Then, the semiconductor substrate 110 is subjected to a surface-texturing treatment. The surface-texturing treatment may be performed using a wet method using a strong acid such as nitric acid and hydrofluoric acid, or a strong base such as sodium hydroxide, or using a dry method using a plasma, for example.

Then, the semiconductor substrate 110 may be doped with an n-type impurity, for example. The n-type impurity may be doped by diffusing $POCl_3$, $H_3PO_4$, or the like using heat-treatment at a high temperature of about 600 to about 1200° C. The semiconductor substrate 110 includes a lower semiconductor layer 110a and an upper semiconductor layer 110b doped with different impurities than each other.

Then, a conductive paste for a front electrode is disposed on the upper semiconductor layer 110b. The conductive paste for a front electrode may be disposed using a screen printing method. The screen printing method includes coating the conductive paste including a conductive powder, a metallic glass, and an organic vehicle on the location where a front electrode is to be disposed (i.e., formed), and then drying the same.

As further disclosed above, the conductive paste may comprise a metallic glass which may be in the form of a glass frit. The metallic glass may be prepared using any suitable method, such as melt spinning, infiltration casting, gas atomization, ion irradiation, or mechanical alloying.

Then, the conductive paste for a front electrode is dried.

A dielectric layer 130 may be disposed by disposing (e.g., laminating) aluminum oxide ($Al_2O_3$) or silicon oxide ($SiO_2$) on the rear side of the semiconductor substrate 110, using a plasma enhanced chemical vapor deposition ("PECVD") method, for example.

Then, a penetration part 135 may be disposed (e.g., formed) on a portion of the dielectric layer 130 by using a laser, for example.

The conductive paste for a rear electrode is subsequently coated on a side of the dielectric layer 130 using a screen printing method.

Then, the conductive paste for a rear electrode is dried.

Next, the conductive pastes for the front and rear electrodes are co-fired. However, the conductive pastes for the front and rear electrodes may be fired individually.

The firing may be performed at a higher temperature than the melting temperature of the conductive metal and may be performed in a furnace, for example, at a temperature ranging from about 400 to about 1000° C., specifically about 450 to about 950° C., more specifically about 500 to about 900° C.

Hereinafter, a solar cell according to another embodiment is disclosed referring to FIGS. 12A and B.

Figure 12A:
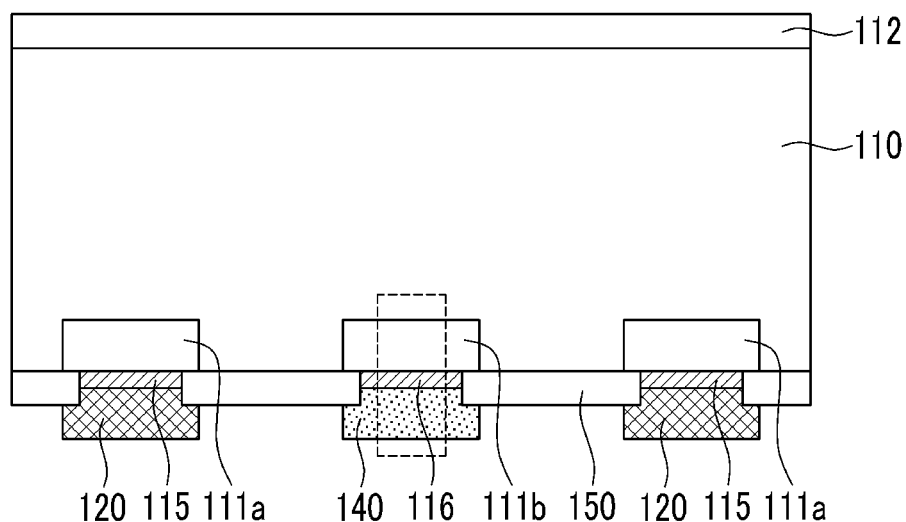
FIG. 12A is a cross-sectional view showing another embodiment of a solar cell.

FIG. 12A is a cross-sectional view showing a solar cell according to another embodiment.

A solar cell according to the embodiment may include a semiconductor substrate 110 doped with a p-type impurity or an n-type impurity. The semiconductor substrate 110 may include a first doping region 111a and second doping region 111b that are provided on the rear side and doped with impurities differing from each other. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured and therefore may enhance light-absorption rate and decrease reflectivity, resultantly improving efficiency of a solar cell. An insulation layer 112 is provided on the semiconductor substrate 110. The insulation layer 112 may comprise an insulating material that absorbs little light (i.e., is substantially transparent), for example silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), or a combination thereof. It may be a single layer or more than one layer. The insulation layer 112 may have a thickness ranging from about 200 to about 1500 Å, specifically about 300 to about 1400 Å, more specifically about 400 to about 1300 Å.

The insulation layer 112 may be an anti-reflective coating ("ARC") that decreases light reflectivity, and increases selective transmission of a particular wavelength region to the surface of the solar cell. Also, the insulation layer 112 may improve the contact characteristics with silicon on the surface of the semiconductor substrate 110, resulting in increased efficiency of the solar cell.

A dielectric layer 150 including a plurality of penetration parts may be disposed on the rear side of the semiconductor substrate 110.

The front electrode 120, which is electrically connected with the first doping region 111a, and the rear electrode 140, which is electrically connected with the second doping region 111b, are disposed on the rear side of the semiconductor substrate 110, respectively. The front electrode 120 may contact the first doping region 111a through a penetration part. Likewise, the rear electrode 140 may contact the second doping region 111b through a penetration part. The front electrode 120 and the rear electrode 140 may be alternately disposed.

As is further disclosed in the above embodiment, the front electrode 120 and the rear electrode 140 may be disposed using a conductive paste including a conductive powder, a metallic glass, and an organic vehicle, which is the same as described above.

A first buffer layer 115 is disposed between the first doping region 111a and the front electrode 120, and a second buffer layer 116 is disposed between the second doping region 111b and the rear electrode 140. While not wanting to be bound by theory, it is believed that the first buffer layer 115 and the second buffer layer 116 may be electrically conductive due to inclusion of a metallic glass. Because the first buffer layer 115 contacts the front electrode 120 and the first doping region 111a, and because the second buffer layer 116 contacts the rear electrode 140 and the second doping region 111b, fewer electric charges may be lost by enlarging a path for transferring charges between the first doping region 111a and the front electrode 120, or between the second doping region 111b and the rear electrode 140. In addition, the first buffer layer 115 and the second buffer layer 116 may substantially or effectively prevent a material of the front electrode 120 and/or the rear electrode 140, respectively, from diffusing into the first and/or second doping regions 111a and 111b, respectively.

Figure 12B:
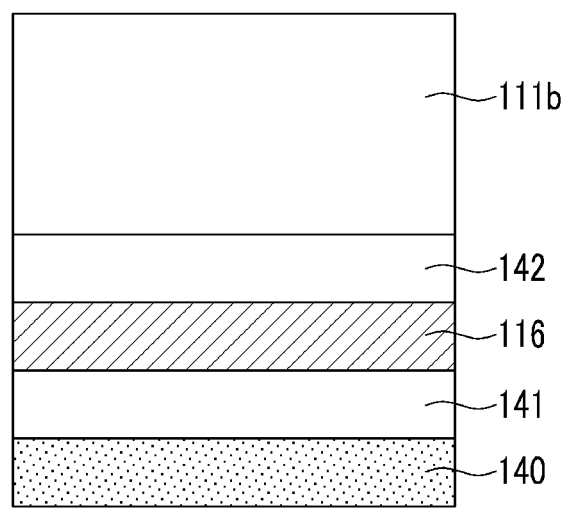
FIG. 12B is an enlarged view of the indicated portion of FIG. 12A.

A first eutectic layer 117, comprising a eutectic product of a conductive material of the front electrode 120 and a metallic glass of the first buffer layer 115 is disposed between the front electrode 120 and the first buffer layer 115. A second eutectic layer 118 including a eutectic product of a semiconductor material and a metallic glass is disposed between the first doping region 111a and the buffer layer first 115. Also, as shown in FIG. 12B, the third eutectic layer 141, which comprises a eutectic product of a conductive material of the rear electrode 140 and a metallic glass of the second buffer layer 116, is disposed between the rear electrode 140 and the second buffer layer 116. Also, the fourth eutectic layer 142, which comprises a eutectic product of the semiconductor material and a metallic glass of the second buffer layer 116, is disposed between the second doping region 111b and the second buffer layer 116.

According to the foregoing embodiment, both of the front and rear electrodes 120 and 140 are disposed on the rear surface of a solar cell and may thus decrease an area wherein a metal is disposed on the front surface of the solar cell. This may decrease shadowing loss and increase solar cell efficiency.

Hereinafter, the method of manufacturing a solar cell will be further disclosed.

First, a semiconductor substrate 110 doped with, for example, an n-type impurity is provided. Then, the semiconductor substrate 110 is surface-textured, and insulation layer 112 and dielectric layer 150 are disposed on front and rear sides of the semiconductor substrate 110, respectively. The insulation layer 112 and the dielectric layer 150, as an example, may be provided using a chemical vapor deposition ("CVD") method.

Then, the first doping region 111a and the second doping region 111b may be formed by sequentially doping a p-type impurity and an n-type impurity in a high concentration, e.g. a concentration of about $10^{16}$ to $10^{22}$ atom/cc, respectively, on the rear side of the semiconductor substrate 110. Then, a conductive paste for a front electrode is disposed on a side of the dielectric layer 150 corresponding to the first doping region 111a, and a conductive paste for a rear electrode is applied on the other side, corresponding to the second doping region 111b. The conductive pastes for the front and rear electrodes may be disposed using a screen printing method, for example. The conductive paste may include the conductive powder, the metallic glass, the dispersing agent, and the organic vehicle, respectively.

Next, the conductive pastes for the front and rear electrodes may be fired together or individually. The firing may be performed at a temperature which is higher than the melting temperature of a conductive metal, and the firing may be performed in a furnace.

The following examples illustrate this disclosure in more detail. However, it is understood that this disclosure is not limited by these examples.

Preparation of a Conductive Paste

Example 1

Polyoxyethylene 1,1,3,3-tetramethylbutylphenyl ether carboxylic acid as a dispersing agent is added to an organic vehicle, and silver (Ag) powder and metallic glass $Cu_{43}Zr_{43}Al_7Ag_7$ are added thereto. The mixture is kneaded with a 3-roll mill, preparing a conductive paste. Herein, the silver (Ag) powder, the metallic glass $Cu_{43}Zr_{43}Al_7Ag_7$, and the organic vehicle are included in an amount of about 82 weight percent (wt %), about 4 wt %, and about 14 wt %, respectively, based on the total weight of the conductive paste. The dispersing agent is included in an amount of about 0.5 parts by weight, based on 100 parts by weight of the silver (Ag) powder and the metallic glass solid.

Example 2

A conductive paste is prepared according to the same method as Example 1, except for using about 1.0 part by weight of the dispersing agent.

Example 3

A conductive paste is prepared according to the same method as Example 1, except for using about 1.5 parts by weight of a dispersing agent.

Example 4

A conductive paste is prepared according to the same method as Example 1, except for using about 2.0 parts by weight of a dispersing agent.

Example 5

A conductive paste is prepared according to the same method as Example 1, except for using about 2.5 parts by weight of a dispersing agent.

Example 6

A conductive paste is prepared according to the same method as Example 1, except for using about 1.5 parts by weight of a dispersing agent, about 84 wt % of silver (Ag) powder, and about 12 wt % of an organic vehicle.

Example 7

A conductive paste is prepared according to the same method as Example 1, except for using about 1.5 parts by weight of a dispersing agent, about 86 wt % of silver (Ag) powder, and about 10 wt % of an organic vehicle.

Comparative Example 1

A conductive paste is prepared according to the same method as Example 1, except the dispersing agent is omitted.

Comparative Example 2

A conductive paste is prepared according to the same method as Example 1, except for using a phosphate-based dispersing agent, BYK 111 (Disperbyk 111, BYK Chemi) as a dispersing agent.

Electrode Fabrication

Example 8

The conductive paste according to Example 3 is coated on a silicon wafer using a screen-printing method. The coated silicon wafer is heated up to about 500° C. using a belt furnace. Then, it is heated up to about 900° C. again and cooled down, fabricating an electrode.

Example 9

An electrode is fabricated according to the same method as Example 8, except for using a conductive paste according to Example 6.

Example 10

An electrode is fabricated according to the same method as Example 8, except for using a conductive paste according to Example 7.

Comparative Example 3

An electrode is fabricated according to the same method as Example 8, except for using a conductive paste according to Comparative Example 1.

Evaluation-1

The viscosity of the conductive pastes according to Examples 1 to 5 and Comparative Examples 1 are determined. Their viscosities are measured using a Brookfield Rheometer RVII.

Hereinafter, the evaluation results thereof are illustrated referring to FIGS. 1 and 2.

FIG. 1 is a graph showing viscosity change of the conductive pastes according to Examples 1 to 4 and Comparative Example 1 as a function of shear rate. FIG. 2 is a graph showing viscosity change of the conductive pastes according to Examples 1 to 5 and Comparative Example 1 at selected shear rates.

Figure 2:
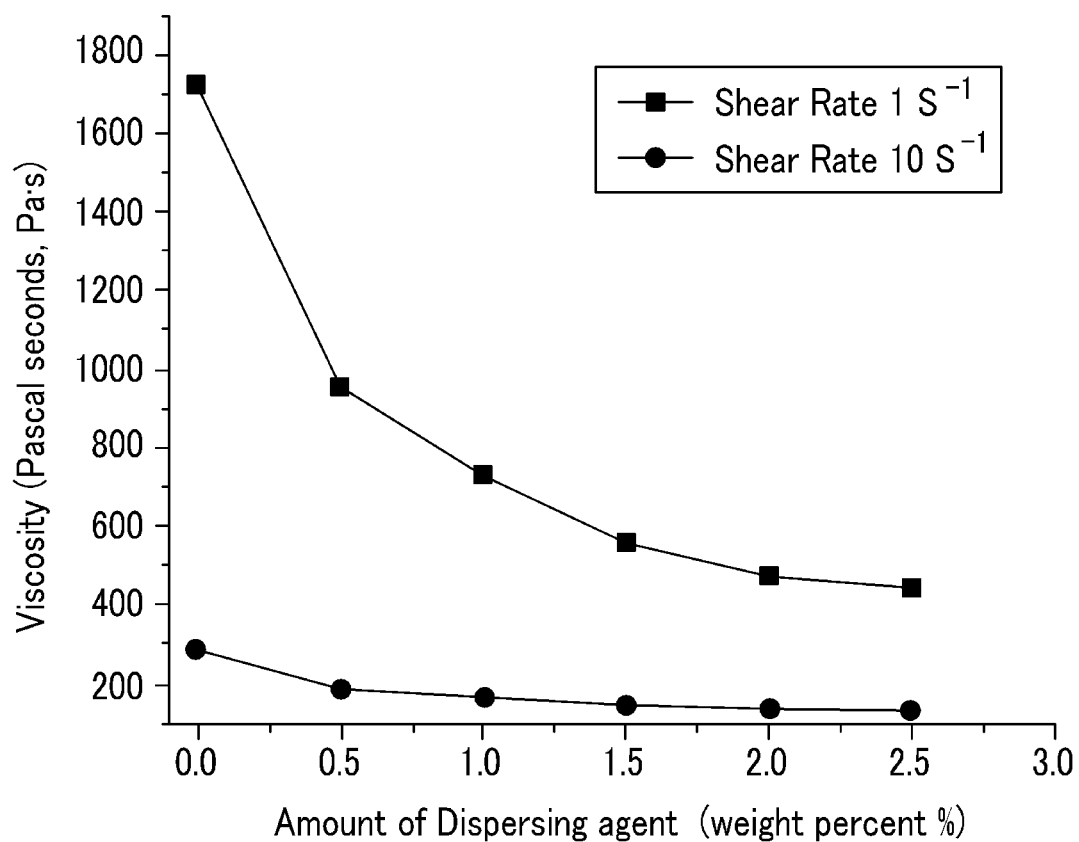
FIG. 2 is a graph of viscosity (Pascal seconds, Pa·S) versus amount of dispersing agent (weight percent, wt %) showing viscosity change of the conductive pastes according to Examples 1 to 5 and Comparative Example 1 at shear rates of 1 $s^{-1}$ and 10 $s^{-1}$.

Referring to FIGS. 1 and 2, the conductive pastes according to Examples 1 to 5 have a lower viscosity than that of Comparative Example 1 at the same shear rate. The more dispersing agent that is included, the lower viscosity the conductive pastes have. The low viscosity indicates dispersion improvement.

Evaluation-2

The resistivity of the electrodes according to Examples 8, 9, and 10 and Comparative Example 3 are measured. The resistivity is calculated by measuring line resistance of a 140 micrometer (μm)-wide and 4 centimeter (cm)-long electrode, and then its line dimension is determined by multiplying an area by the line resistance, and dividing the product by the length.

The results are provided in Table 1.

TABLE 1

| | Example 8 | Example 9 | Example 10 | Comparative Example 3 |
|---|---|---|---|---|
| Conductive powder (wt %) | 82 | 84 | 86 | 82 |
| Solid (wt %) | 86 | 88 | 90 | 86 |
| Dispersing agent (parts by weight) | 1.5 | 1.5 | 1.5 | 0 |
| Resistivity (μΩcm) | 4.14 | 3.73 | 2.6 | 5.92 |

μΩ refers to micro-ohms centimeters

Referring to Table 1, the electrodes according to Examples 8, 9, and 10 have lower resistivity than that of Comparative Example 3. Accordingly, the conductive pastes for the electrodes according to Examples 8, 9, and 10 have better dispersion than that of the electrode according to Comparative Example 3, and include more conductive powder, thereby improving conductivity without having a large viscosity change.

Figure 3A:
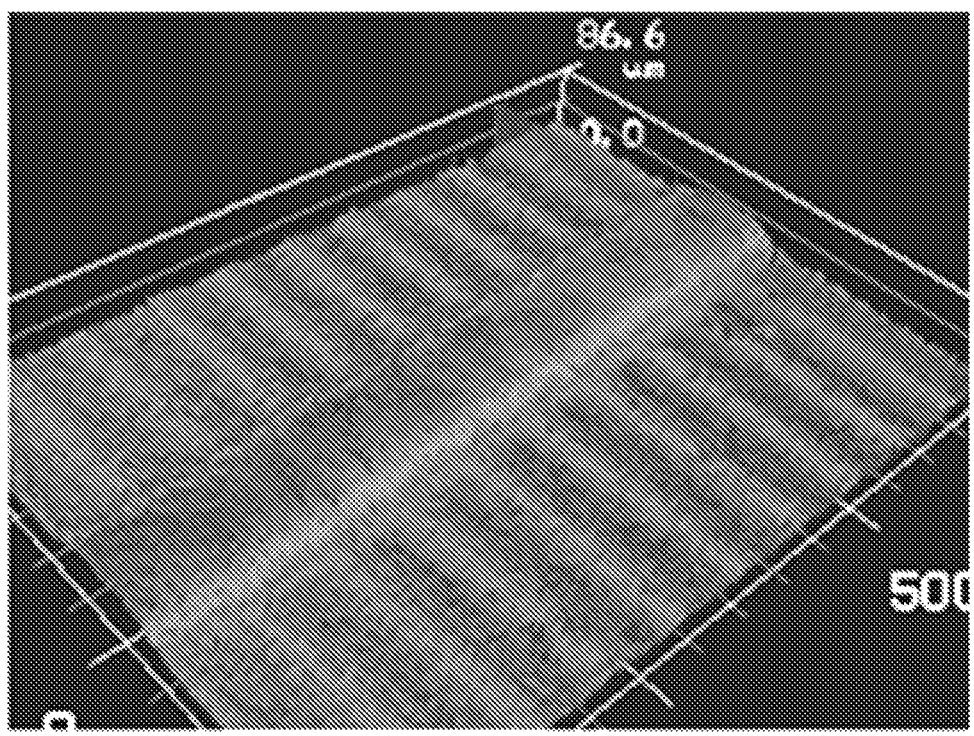
FIG. 3A is a three dimensional ("3D") photograph showing an electrode according to Example 10.
Figure 3B:
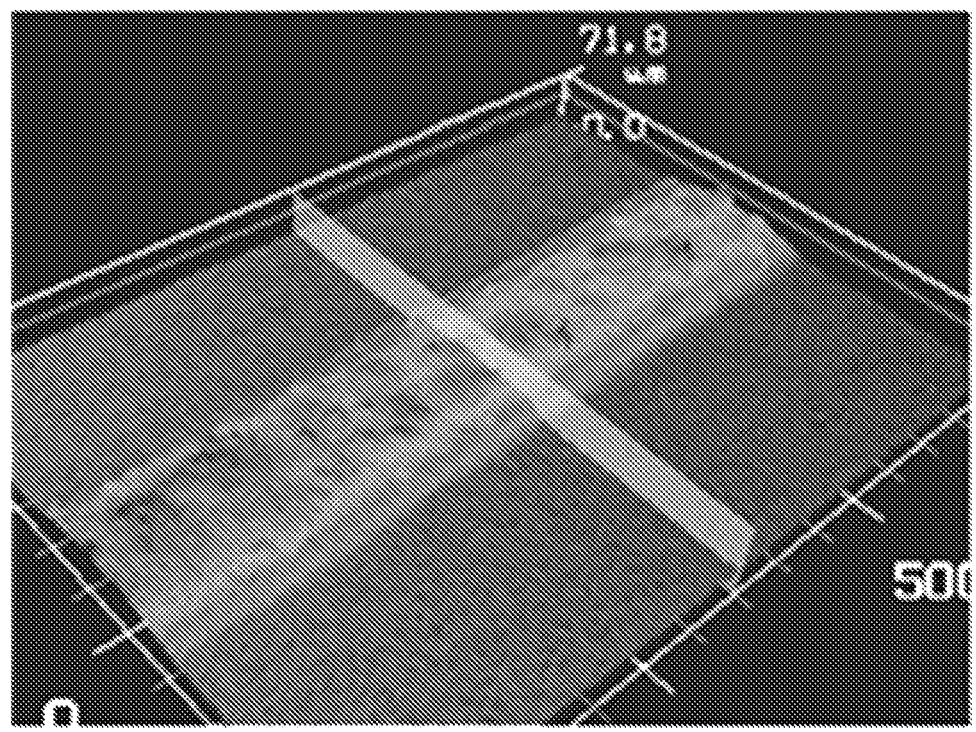
FIG. 3B is a 3D photograph showing an electrode according to Comparative Example 3.

The electrodes according to Example 10 and Comparative Example 3 are further illustrated in FIGS. 3A and 3B.

FIG. 3A is a 3D photograph showing the electrode according to Example 10, and FIG. 3B provides a 3D photograph showing the electrode according to Comparative Example 3.

Referring to FIGS. 3A and 3B, the electrode of Example 10 includes more conductive powder than the one of Comparative Example 3 and the conductive paste used to fabricate the electrode of Example 10 does not have a viscosity increase with respect to the conductive paste used to fabricate the electrode of Comparative Example 3. Thus, while not wanting to be bound by theory, it is believed that particles of the conductive paste of Example 10 have more contact points, which leads to improved sintering properties and provides a smooth electrode. In addition, the increased content of conductive powder improves the visco-elasticity coefficient, and thus decreases spreading, thereby reducing a line width, and increases line height, resulting in a reduction of line resistance.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductive paste comprising a combination of:
a conductive powder;
a metallic glass including an alloy having a disordered atomic structure that includes at least two metals; and
a dispersing agent represented by the following Chemical Formula 1:

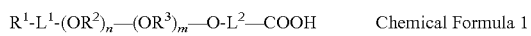
$$R^1\text{-}L^1\text{-}(OR^2)_n\text{—}(OR^3)_m\text{—}O\text{-}L^2\text{—}COOH \qquad \text{Chemical Formula 1}$$

wherein, in Chemical Formula 1,
$R^1$ is a substituted or unsubstituted C5 to C30 branched alkyl group,
$R^2$ and $R^3$ are each independently a substituted or unsubstituted C2 to C5 alkylene group,
$L^1$ is a substituted or unsubstituted C6 to C30 arylene group,
$L^2$ is a single bond or a C1 to C4 alkylene group,
n and m are each independently integers ranging from 0 to about 30, and $3 \leq n+m \leq 30$.

2. The conductive paste of claim 1, wherein the dispersing agent is represented by the following Chemical Formula 2:

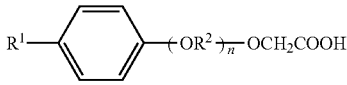

Chemical Formula 2 wherein, in Chemical Formula 2, $R^1$ is a substituted or unsubstituted C5 to C30 branched alkyl group, $R^2$ is a substituted or unsubstituted C2 to C5 alkylene group, and n is an integer ranging from 3 to about 30.

3. The conductive paste of claim 1, wherein the dispersing agent is represented by the following Chemical Formula 3:

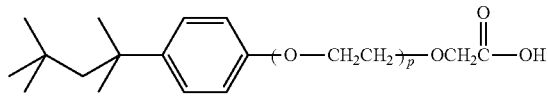

Chemical Formula 3 wherein, in Chemical Formula 3, p is an integer ranging from about 3 to about 10.

4. The conductive paste of claim 1, wherein the dispersing agent is present in an amount of about 0.5 to about 10 parts by weight, based on 100 parts by weight of the conductive powder and the metallic glass.

5. The conductive paste of claim 1, wherein
the alloy of the metallic glass is amorphous, and
the alloy of the metallic glass includes at least one of copper, titanium, nickel, zirconium, iron, magnesium, calcium, cobalt, palladium, platinum, gold, cerium, lanthanum, yttrium, gadolinium, beryllium, tantalum, gallium, aluminum, hafnium, niobium, lead, platinum, silver, phosphorus, boron, silicon, carbon, tin, molybdenum, tungsten, manganese, erbium, chromium, praseodymium, thulium, and a combination thereof.

6. The conductive paste of claim 1, wherein
the metallic glass has a glass transition temperature that is lower than a eutectic point of silicon and the conductive powder.

7. The conductive paste of claim 6, wherein the conductive powder and the metallic glass have a eutectic point that is lower than a eutectic point of silicon and the conductive powder.

8. The conductive paste of claim 1, wherein the metallic glass is a liquid at a sintering temperature of the conductive powder.

9. The conductive paste of claim 1, wherein the conductive powder comprises at least one of silver, aluminum, copper, nickel, and a combination thereof.

10. The conductive paste of claim 1, further comprising: an organic vehicle.

11. The conductive paste of claim 10, wherein the conductive powder, the metallic glass, and the organic vehicle are present in an amount of about 30 to about 98 weight percent, about 1 to about 50 weight percent, and about 1 to about 50 weight percent, respectively, based on the total weight of the conductive paste, and
the dispersing agent is present in an amount of about 0.5 to about 10 parts by weight, based on 100 parts by weight of the conductive powder and the metallic glass.

12. An electronic device comprising an electrode prepared using the conductive paste of claim 1.

13. The electronic device of claim 12, wherein the dispersing agent is represented by the following Chemical Formula 2:

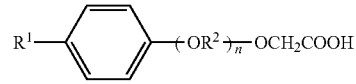

Chemical Formula 2 wherein, in Chemical Formula 2, $R^1$ is a substituted or unsubstituted C5 to C30 branched alkyl group, $R^2$ is a substituted or unsubstituted C2 to C5 alkylene group, and n is an integer ranging from 3 to about 30.

14. The electronic device of claim 12, wherein the dispersing agent is represented by the following Chemical Formula 3:

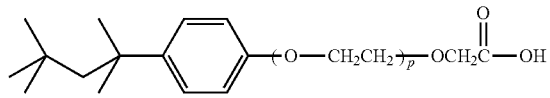

Chemical Formula 3 wherein, in Chemical Formula 3, p is an integer ranging from about 3 to about 10.

15. A solar cell comprising:
a silicon-containing semiconductor layer, and
an electrode electrically connected with the semiconductor layer,
wherein the electrode comprises a fired product of a conductive paste, the conductive paste comprising
a conductive powder,
a metallic glass, the metallic glass including an alloy having a disordered atomic structure that includes at least two metals, and
a dispersing agent represented by the following Chemical Formula 1:

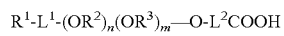
$$R^1\text{-}L^1\text{-}(OR^2)_n(OR^3)_m\text{—}O\text{-}L^2COOH \qquad \text{Chemical Formula 1}$$

wherein, in Chemical Formula 1,

R¹ is a substituted or unsubstituted C5 to C30 branched alkyl group, R² and R³ are each independently a substituted or unsubstituted C2 to C5 alkylene group, L¹ is a substituted or unsubstituted C6 to C30 arylene group, L² is a single bond or a C1 to C4 alkylene group, n and m are each independently integers ranging from 0 to about 30, and 3≤n+m≤30.

16. The solar cell of claim 15, wherein the dispersing agent is represented by the following Chemical Formula 2:

Chemical Formula 2

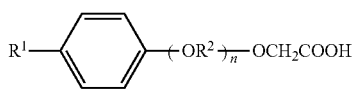

wherein, in Chemical Formula 2, R¹ is a substituted or unsubstituted C5 to C30 branched alkyl group, R² is a substituted or unsubstituted C2 to C5 alkylene group, and n is an integer ranging from 3 to about 30.

17. The solar cell of claim 15, wherein the dispersing agent is represented by the following Chemical Formula 3:

Chemical Formula 3

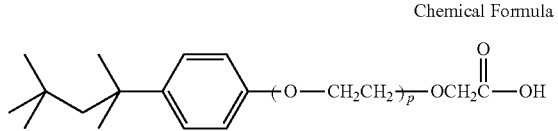

wherein, in Chemical Formula 3, p is an integer ranging from about 3 to about 10.

18. The solar cell of claim 15, wherein
the electrode includes an electrode portion and a buffer layer,
the buffer layer is between the semiconductor layer and the electrode portion, and the buffer layer is formed from the metallic glass.

19. The solar cell of claim 18, wherein
the electrode further comprises a first eutectic layer,
the first eutectic layer is between the electrode portion and the buffer layer, and
the first eutectic layer is a product of the conductive powder and the metallic glass.

20. The solar cell of claim 19, wherein
the electrode further comprises a second eutectic layer,
the second eutectic layer is between the semiconductor layer and the buffer layer, and
the second eutectic layer is a product of the semiconductor material and the metallic glass.

21. The solar cell of claim 15, wherein
the alloy of the metallic glass is amorphous, and
the alloy of the metallic glass includes at least one of copper, titanium, nickel, zirconium, iron, magnesium, calcium, cobalt, palladium, platinum, gold, cerium, lanthanum, yttrium, gadolinium, beryllium, tantalum, gallium, aluminum, hafnium, niobium, lead, platinum, silver, phosphorus, boron, silicon, carbon, tin, molybdenum, tungsten, manganese, erbium, chromium, praseodymium, thulium, and a combination thereof.

22. The solar cell of claim 15, wherein the conductive powder comprises at least one of silver, aluminum, copper, nickel, and a combination thereof.

23. The conductive paste of claim 1, further comprising: glass frit.

24. The conductive paste of claim 1, wherein the alloy of the metallic glass includes two to six metals.

25. The electronic device of claim 15, wherein the conductive paste further comprises glass frit.

26. The electronic device of claim 15, wherein the alloy of the metallic glass includes two to six metals.

* * * * *